United States Patent
Chan et al.

(10) Patent No.: US 12,542,488 B2
(45) Date of Patent: Feb. 3, 2026

(54) SIGNAL DELAY SETTING CIRCUIT, ISOLATION INTEGRATED CIRCUIT AND POWER CONVERSION CIRCUITRY

(71) Applicant: PowerX Semiconductor Corporation, Hsinchu County (TW)

(72) Inventors: Jui Teng Chan, Hsinchu County (TW); Yong Cyuan Chen, Hsinchu County (TW); Jo-Yu Wang, Hsinchu County (TW); Chih-Yuan Hsu, Hsinchu County (TW); Chung-Kang Wu, Hsinchu County (TW)

(73) Assignee: PowerX Semiconductor Corporation, Hsinchu County (TW)

( * ) Notice: Subject to any disclaimer, the term of this patent is extended or adjusted under 35 U.S.C. 154(b) by 214 days.

(21) Appl. No.: 18/412,623

(22) Filed: Jan. 15, 2024

(65) Prior Publication Data

US 2025/0132671 A1 Apr. 24, 2025

(30) Foreign Application Priority Data

Oct. 24, 2023 (TW) ................................ 112140656

(51) Int. Cl.
*H02M 3/158* (2006.01)
*H02M 1/32* (2007.01)
(Continued)

(52) U.S. Cl.
CPC ............. *H02M 3/158* (2013.01); *H02M 1/32* (2013.01); *H02M 1/38* (2013.01); *H02M 3/157* (2013.01); *H03K 5/13* (2013.01)

(58) Field of Classification Search
CPC .......... H02M 3/158; H02M 1/32; H02M 1/38; H02M 3/157; H03K 5/13
See application file for complete search history.

(56) References Cited

U.S. PATENT DOCUMENTS 6,466,077 B1 * 10/2002 Miyazaki ................ G05F 3/205
327/276
10,734,982 B2 8/2020 Abesingha et al.
(Continued)

FOREIGN PATENT DOCUMENTS

CN 102882510 B 7/2015
CN 105322929 A 2/2016
(Continued)

*Primary Examiner* — Rafael O De Leon Domenech
(74) *Attorney, Agent, or Firm* — CKC & Partners Co., LLC

(57) ABSTRACT

The present disclosure provides a signal delay setting circuit, an isolation integrated circuit and a power conversion circuitry. The isolation integrated circuit includes a primary side circuit, an isolation circuit and a secondary side circuit. The primary side circuit generates a primary side signal according to a first input signal and a second input signal. The isolation circuit converts the primary side signal into a secondary side signal. The secondary side circuit receives the secondary side signal through the isolation circuit, to generate an output signal. The signal delay setting circuit is coupled to the secondary side circuit, calculates a delay time according to a voltage difference between an alternative terminal and a secondary side ground terminal of the isolation integrated circuit, and delays the secondary side signal according to the delay time, to control the duty ratio of the output signal.

20 Claims, 6 Drawing Sheets

(51) Int. Cl.
*H02M 1/38* (2007.01)
*H02M 3/157* (2006.01)
*H03K 5/13* (2014.01)

(56) References Cited

U.S. PATENT DOCUMENTS

2004/0120090 A1* 6/2004 Galli .................. H02M 3/3376
361/115
2013/0009674 A1* 1/2013 Reese .................. H03K 5/2481
327/109
2020/0395944 A1* 12/2020 Tsuji ........................ H03L 5/00

FOREIGN PATENT DOCUMENTS

| CN | 112865531 A | 5/2021 |
| TW | 201419723 A | 5/2014 |
| TW | 201545475 A | 12/2015 |
| TW | 202015322 A | 4/2020 |
| TW | 202243383 A | 11/2022 |
| WO | 2022/133691 A1 | 6/2022 |

* cited by examiner

SIGNAL DELAY SETTING CIRCUIT, ISOLATION INTEGRATED CIRCUIT AND POWER CONVERSION CIRCUITRY

CROSS-REFERENCE TO RELATED APPLICATION

This application claims priority to Taiwan Application Serial Number 112140656, filed Oct. 24, 2023, which is herein incorporated by reference in its entirety.

BACKGROUND

Field of Disclosure

The present disclosure relates to a signal delay setting circuit, and in particular, to a signal delay setting circuit applicable to an isolation integrated circuit.

Description of Related Art

In a circuit structure including a high-side switch and a low-side switch, it is usually necessary to alternately turn on the high-side switch and the low-side switch to complete an operation. However, the high-side switch and the low-side switch may be turned on at the same time due to some non-ideal factors, which leads to a high current flow that may cause damage to the high-side switch and the low-side switch.

Some related art techniques ensure that the high-side switch and low-side switch are not turned on at the same time by using RC circuit settings or using trimming methods to generate a dead zone or dead time. However, each of these related art techniques has its own disadvantages. For example, a dead time generated using techniques related to an RC circuit may have a high deviation due to physical characteristics of a resistor and/or a capacitor. For example, related art techniques using trimming methods may increase the complexity of the entire system. Therefore, it is necessary to propose a novel approach to address the aforementioned issues.

SUMMARY

One aspect of the present disclosure is a signal delay setting circuit applicable to an isolation integrated circuit. The isolation integrated circuit includes a primary side circuit, an isolation circuit, and a secondary side circuit. The isolation circuit is configured to convert a primary side signal from the primary side circuit into a secondary side signal, and the secondary side circuit is coupled to an alternative terminal and a secondary side ground terminal of the isolation integrated circuit. The signal delay setting circuit includes a voltage drop generating circuit, a delay time calculation circuit, and a signal delay circuit. The voltage drop generating circuit is coupled to the alternative terminal and the secondary side ground terminal, and generates a voltage difference between the alternative terminal and the secondary side ground terminal. The delay time calculation circuit is coupled to the voltage drop generating circuit, and calculates a delay time according to the voltage difference. The signal delay circuit is coupled to the delay time calculation circuit, and delays the secondary side signal received by the secondary side circuit from the isolation circuit according to the delay time, so as to control a duty ratio of an output signal generated by the secondary side circuit according to the secondary side signal, where the primary side signal is generated by the primary side circuit according to a first input signal and a second input signal.

One aspect of the present disclosure is an isolation integrated circuit. The isolation integrated circuit includes a primary side circuit, an isolation circuit, a secondary side circuit, and a signal delay setting circuit. The primary side circuit receives a first input signal and a second input signal and generates a primary side signal according to the first input signal and the second input signal. The isolation circuit is coupled to the primary side circuit, and converts the primary side signal into a secondary side signal. The secondary side circuit is coupled to the isolation circuit, receives the secondary side signal via the isolation circuit, generates an output signal according to the secondary side signal, and receives a secondary side power voltage. The signal delay setting circuit is coupled to the secondary side circuit and an alternative terminal and a secondary side ground terminal of the isolation integrated circuit, detects a voltage difference between the alternative terminal and the secondary side ground terminal when the secondary side power voltage exceeds a predetermined voltage, calculates a delay time according to the voltage difference, and delay the secondary side signal according to the delay time to control a duty ratio of the output signal.

One aspect of the present disclosure is a power conversion circuitry. The power conversion circuitry includes a high-side switch, a low-side switch, a controller circuit, a first isolation integrated circuit, and a second isolation integrated circuit. The controller circuit outputs a first input signal and a second input signal. The first isolation integrated circuit is coupled between the controller circuit and the high-side switch, includes a first signal delay setting circuit, a first signal input terminal, a second signal input terminal, a first alternative terminal, and a first secondary side ground terminal, receives the first input signal via the first signal input terminal, and receives the second input signal via the second signal input terminal, to generate a first output signal for driving the high-side switch. The second isolation integrated circuit is coupled between the controller circuit and the low-side switch, includes a second signal delay setting circuit, a third signal input terminal, a fourth signal input terminal, a second alternative terminal, and a second secondary side ground terminal, receives the second input signal via the third signal input terminal, and receives the first input signal via the fourth signal input terminal, to generate a second output signal for driving the low-side switch. When a first secondary side power voltage received by the first isolation integrated circuit and a second secondary side power voltage received by the second isolation integrated circuit exceed a predetermined voltage, the first signal delay setting circuit calculates a first delay time according to a first voltage difference between the first alternative terminal and the first secondary side ground terminal, and the second signal delay setting circuit calculates a second delay time according to a second voltage difference between the second alternative terminal and the second secondary side ground terminal. When the first secondary side power voltage and the second secondary side power voltage exceed a protection voltage greater than the predetermined voltage, the first signal delay setting circuit delays a first secondary side signal generated by the first isolation integrated circuit according to the first input signal and the second input signal according to the first delay time to control a duty ratio of the first output signal, and the second signal delay setting circuit delays a second secondary side signal generated by the second isolation integrated circuit according to the first input signal and the second input signal according to the second delay time to control a duty ratio of the second output signal, so that the high-side switch and the low-side switch are not turned on at the same time.

To sum up, by controlling, by the signal delay setting circuit, the duty ratio of the output signal generated by the isolation integrated circuit, the power conversion circuitry of the present disclosure can effectively generate a dead time to protect the high-side switch and the low-side switch. In addition, compared with some related art techniques that generate a dead time by using RC circuit settings or using trimming methods, the isolation integrated circuit and the power conversion circuitry of the present disclosure have the advantages of low deviation, high reliability, small requirements for circuit area, and the like.

DETAILED DESCRIPTION

The following is detailed descriptions of embodiments with the attached drawings, but the specific embodiments described are only configured to explain this application, and are not configured to limit this application. Descriptions of structure operations is not configured to limit an execution order, and any apparatuses with equivalent functions generated by the recombination of components are covered by the present disclosure.

Unless otherwise specified, the terms used in the whole specification and the patent application usually have the ordinary meaning of each term used in this field, in the content disclosed here and in special content.

As used herein, "coupled" or "connected" may mean that two or more components are in direct physical or electrical contact with each other, or indirect physical or electrical contact with each other, or that two or more components operate or act with each other.

Figure 1:
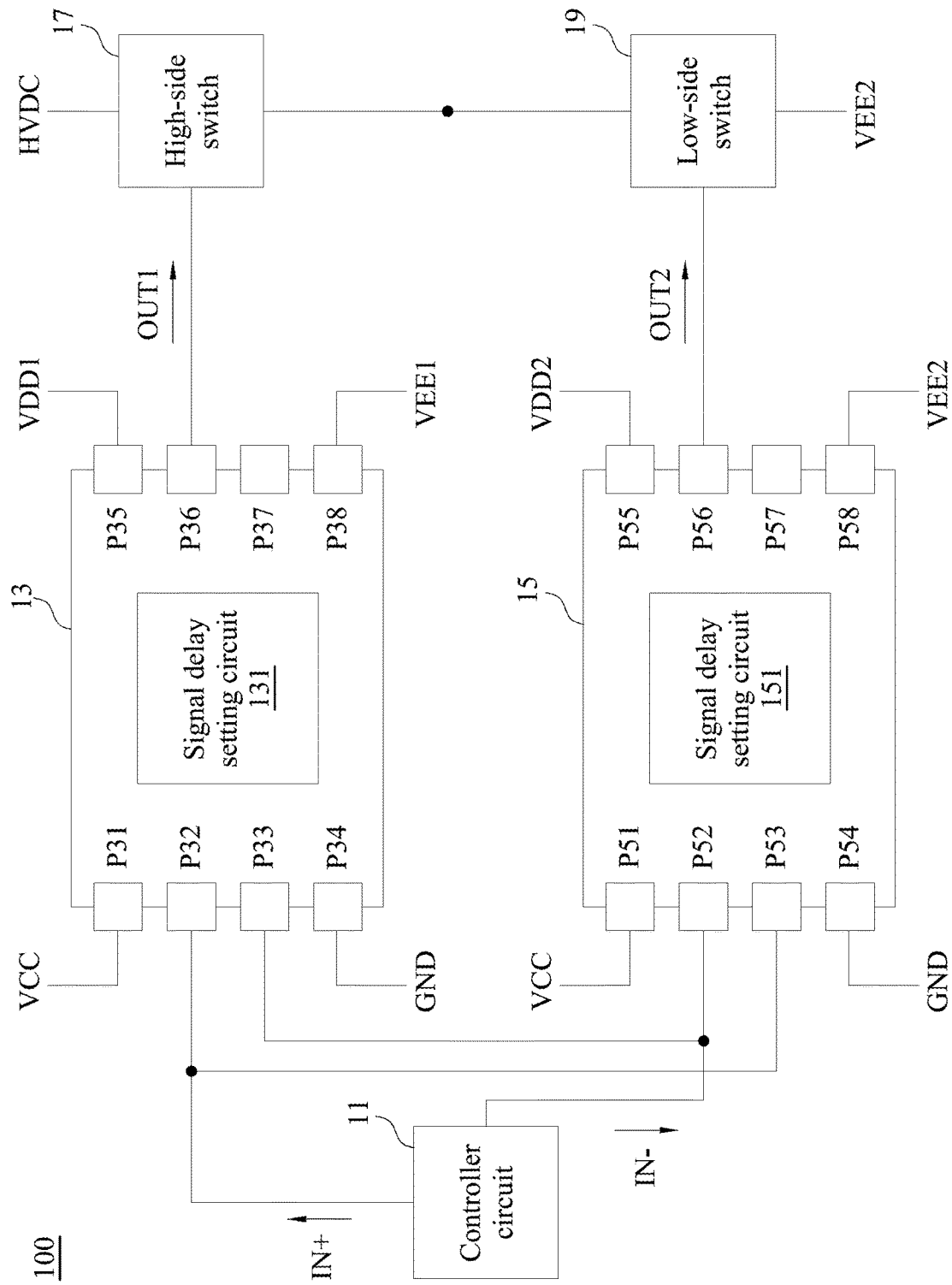
FIG. 1 is a circuit block diagram of a power conversion circuitry according to some embodiments of the present disclosure.

Refer to FIG. 1. FIG. 1 is a circuit block diagram of a power conversion circuitry 100 according to some embodiments of the present disclosure. In some embodiments, the power conversion circuitry 100 includes a controller circuit 11, an isolation integrated circuit 13, an isolation integrated circuit 15, a high-side switch 17 and a low-side switch 19. Specifically, the power conversion circuitry 100 may be, for example, but not limited to, a buck converter.

In some embodiments, as shown in FIG. 1, the controller circuit 11 is electrically coupled to the isolation integrated circuit 13 and the isolation integrated circuit 15. The isolation integrated circuit 13 is electrically coupled to the high-side switch 17, and the second isolation integrated circuit 15 is electrically coupled to the low-side switch 19. Further, the high-side switch 17 and the low-side switch 19 are connected in series. It should be understood that in some embodiments, a connection node (depicted by a dot) between the high-side switch 17 and the low-side switch 19 may be electrically coupled to a load circuit (not shown).

According to a circuit architecture of the power conversion circuitry 100, in some embodiments, the controller circuit 11 is configured to output a first input signal IN+ and a second input signal IN− to the isolation integrated circuit 13 and the isolation integrated circuit 15, wherein the first input signal IN+ and the second input signal IN− are out of phase, but the present invention is not limited to this. The isolation integrated circuit 13 is configured to generate an output signal OUT1 to the high-side switch 17 according to the first input signal IN+ and the second input signal IN−. The isolation integrated circuit 15 is configured to generate an output signal OUT2 to the low-side switch 19 according to the first input signal IN+ and the second input signal IN−. Driven by the output signals OUT1 and OUT2, the high-side switch 17 and the low-side switch 19 may be turned on alternately to generate an output current (not shown) flowing through the load circuit. In some embodiments, the first input signal IN+, the second input signal IN−, the output signal OUT1, and the output signal OUT2 are all periodic signals. In addition, the output signal OUT1 and the output signal OUT2 are substantially out of phase, so that the high-side switch 17 and the low-side switch 19 may be driven to be turned on alternately.

In some embodiments, the isolation integrated circuit 13 includes a primary side power terminal P31, a first signal input terminal P32, a second signal input terminal P33, a primary side ground terminal P34, a secondary side power terminal P35, a signal output terminal P36, an alternative terminal P37, and a secondary side ground terminal P38. As shown in FIG. 1, the isolation integrated circuit 13 receives a primary side power voltage VCC via the primary side power terminal P31, receives the first input signal IN+ via the first signal input terminal P32, receives the second input signal IN− via the second signal input terminal P33, receives a primary side ground voltage GND via the primary side ground terminal P34, receives a secondary side power voltage VDD1 via the secondary side power terminal P35, outputs an output signal OUT1 via the signal output terminal P36, and receives a secondary side ground voltage VEE1 via the secondary side ground terminal P38.

In some embodiments, the isolation integrated circuit 15 includes a primary side power terminal P51, a first signal input terminal P52, a second signal input terminal P53, a primary side ground terminal P54, a secondary side power terminal P55, a signal output terminal P56, an alternative terminal P57, and a secondary side ground terminal P58. As shown in FIG. 1, the isolation integrated circuit 15 receives a primary side power voltage VCC via the primary side power terminal P51, receives the second input signal IN− via the first signal input terminal P52, receives the first input signal IN+ via the second signal input terminal P53, receives a primary side ground voltage GND via the primary side ground terminal P54, receives a secondary side power voltage VDD2 via the secondary side power terminal P55, outputs the output signal OUT2 via the signal output terminal P56, and receives a secondary side ground voltage VEE2 via the secondary side ground terminal P58.

In the above embodiment, as shown in FIG. 1, the high-side switch 17 is coupled to a third power voltage HVDC, and the low-side switch 19 is coupled to the secondary side ground voltage VEE2. To be specific, the high-side switch 17 and the low-side switch 19 are connected in series between the third power voltage HVDC and the secondary side ground voltage VEE2. In the above embodiments, voltage values of the primary side power voltage VCC, the secondary side power voltage VDD1, the secondary side power voltage VDD2, and the third power voltage HVDC may all be the same, different, or partially the same, while voltage values of the primary side ground voltage GND, the secondary side ground voltage VEE1, and the secondary side ground voltage VEE2 may all be the same or completely different.

Generally speaking, the high-side switch 17 and the low-side switch 19 may each be implemented by using one or more transistors (for example, metal oxide semiconductor (MOS) transistors). Therefore, if the high-side switch 17 and the low-side switch 19 are turned on at the same time due to some non-ideal factors, a large current may flow through the high-side switch 17 and the low-side switch 19, which further causes the high-side switch 17 and the low-side switch 19 or internal transistors to burn out.

In view of this, in some embodiments, the isolation integrated circuit 13 is configured with a signal delay setting circuit 131, and the isolation integrated circuit 15 is configured with a signal delay setting circuit 151. It is worth noting that the signal delay setting circuit 131 and the signal delay setting circuit 151 are configured to control a duty ratio of the output signal OUT1 and a duty ratio of the output signal OUT2, respectively, so as to ensure that the high-side switch 17 and the low-side switch 19 cannot be turned on at the same time.

Figure 2:
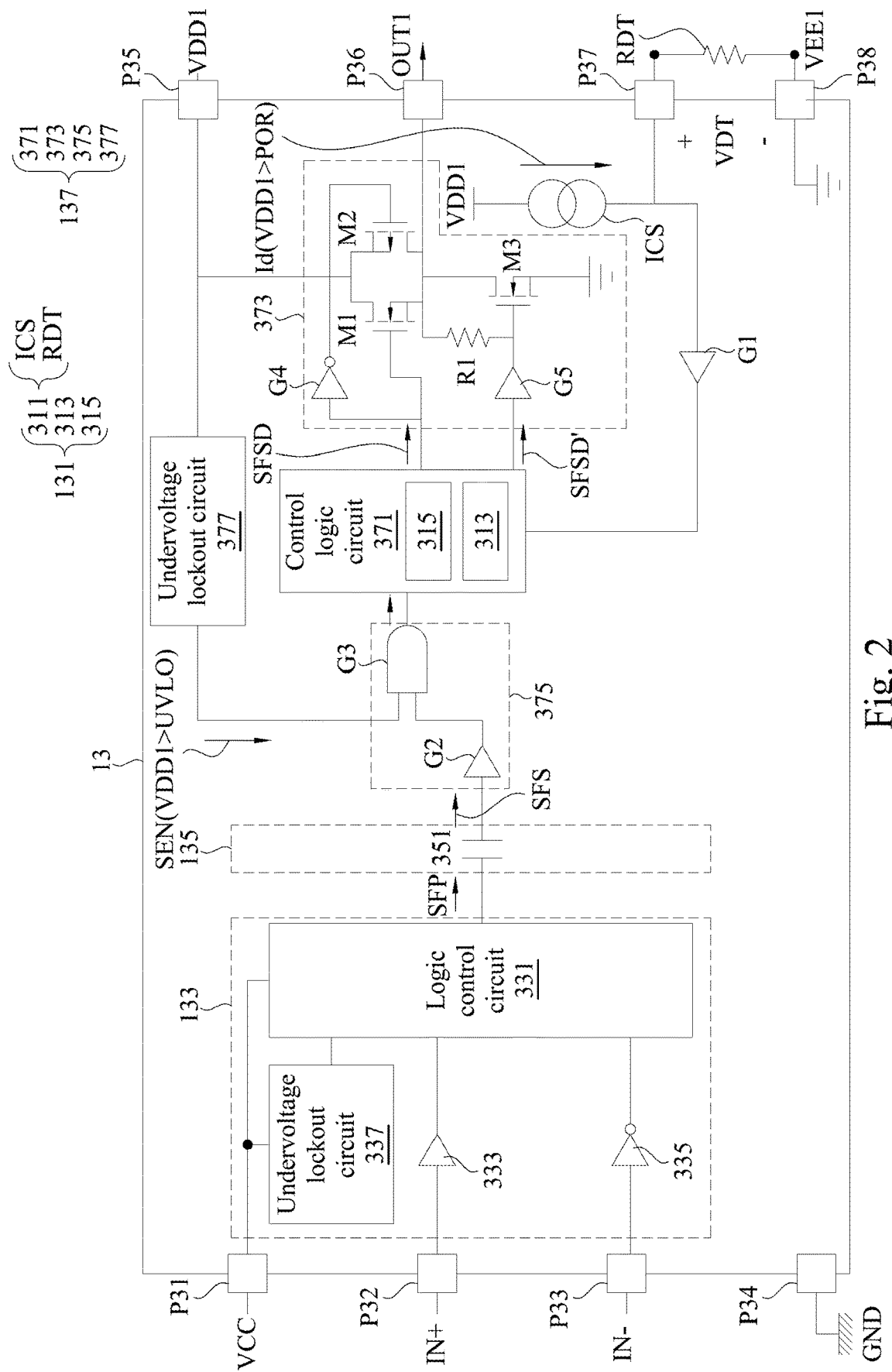
FIG. 2 is a schematic circuit diagram of an isolation integrated circuit according to some embodiments of the present disclosure.

Next, the isolation integrated circuit 13 will be described in detail with reference to FIG. 2. FIG. 2 is a schematic circuit diagram of the isolation integrated circuit 13 according to some embodiments of the present disclosure. In some embodiments, the isolation integrated circuit 13 includes the signal delay setting circuit 131, a primary side circuit 133, an isolation circuit 135, and a secondary side circuit 137. Specifically, the isolation integrated circuit 13 may be, for example, but not limited to, a gate driver. That is, in some embodiments, the output signal OUT1 is output to a gate of a transistor in the high-side switch 17.

In some embodiments, the signal delay setting circuit 131 includes a voltage drop generating circuit 311, a delay time calculation circuit 313, and a signal delay circuit 315. In some further embodiments, the voltage drop generating circuit 311 includes a current generating circuit ICS and a resistor component RDT. Specifically, the current generating circuit ICS may be implemented by a current source (such as a current mirror circuit), and the resistor component RDT may be implemented by a resistor. It should be understood that in some embodiments, the resistor component RDT may alternatively be replaced by another suitable passive component (such as a capacitor, an inductor, etc.).

In some embodiments, the primary side circuit 133 includes a logic control circuit 331, a buffer gate 333, a NOT gate 335, and a undervoltage lockout circuit 337. Specifically, the logic control circuit 331 may be implemented by a logic circuit, an oscillator, a modulator, a transmitter, or a combination thereof. In some embodiments, the logic circuit in the logic control circuit 331 may include an AND gate (not shown).

In some embodiments, the buffer gate 333 is coupled between the first signal input terminal P32 and a first data input terminal of the AND gate in the logic control circuit 331. The NOT gate 335 is coupled between the second signal input terminal P33 and a second data input terminal of the AND gate in the logic control circuit 331. The undervoltage lockout circuit 337 is coupled between the primary side power terminal P31 and the logic control circuit 331. Further, the logic control circuit 331 is coupled to the primary side power terminal P31 to directly receive the primary side power voltage VCC.

In some embodiments, one terminal of the isolation circuit 135 is coupled to an output terminal of the primary side circuit 133 (i.e., a data output terminal of the logic control circuit 331), and the other terminal of the isolation circuit 135 is coupled to an input terminal of the secondary side circuit 137, so as to provide electrical insulation between the primary side circuit 133 and the secondary side circuit 137 in the isolation integrated circuit 13 according to system requirements. Accordingly, an operating voltage of the primary side circuit 133 (i.e., the primary side power voltage VCC and the primary side ground voltage GND) may be different from that of the secondary side circuit 137 (i.e., the secondary side power voltage VDD1 and the secondary side ground voltage VEE1). Specifically, the isolation circuit 135 may be implemented with a passive component (e.g., a capacitor 351) or an insulating component (e.g., a transformer).

In some embodiments, the isolation circuit 135 is further used as a communication interface between the primary side circuit 133 and the secondary side circuit 137 while ensuring voltage isolation (i.e., the aforementioned electrical insulation) between the primary side circuit 133 and the secondary side circuit 137, so that data, signals and/or information can be transmitted from the primary side circuit 133 to the secondary side circuit 137, for example, through a voltage coupling phenomenon.

In some embodiments, the secondary side circuit 137 includes a control logic circuit 371, an amplifier circuit 373, a receiving circuit 375, and an undervoltage lockout circuit 377. As shown in FIG. 2, the receiving circuit 375 is coupled to the isolation circuit 135, the undervoltage lockout circuit 377, and the control logic circuit 371. The amplifier circuit 373 is coupled to the control logic circuit 371, the secondary side power terminal P35, and the signal output terminal P36. Further, the undervoltage lockout circuit 377 is coupled to the receiving circuit 375 and also to the secondary side power terminal P35.

In some embodiments, the receiving circuit 375 includes a buffer gate G2 and an AND gate G3. The buffer gate G2 is coupled to the isolation circuit 135 and a first input terminal of the AND gate G3, the undervoltage lockout circuit 377 is coupled to a second input terminal of the AND gate G3, and the control logic circuit 371 is coupled to an output terminal of the AND gate G3.

In some embodiments, the amplifier circuit 373 includes a NOT gate G4, a buffer gate G5, a transistor M1, a transistor M2, a transistor M3, and a resistor R1. A first data output terminal of the control logic circuit 371 is directly coupled to a control terminal (e.g., a gate terminal) of the transistor M1, and is coupled to a control terminal of the transistor M2 via the NOT gate G4. A second data output terminal of the control logic circuit 371 is coupled to a control terminal of the transistor M3 via the buffer gate G5. A first terminal (e.g., a source terminal) of the transistor M1, a second terminal (e.g., a drain terminal) of the transistor M2, and a second terminal of the transistor M3 are all coupled to the signal output terminal P36. A second terminal of the transistor M1 and a first terminal of the transistor M2 are both coupled to the secondary side power terminal P35. A first terminal of the transistor M3 is grounded, and the resistor R1 is coupled between the signal output terminal P36 and the control terminal of the transistor M3.

In some embodiments, the resistor component RDT in the voltage drop generating circuit 311 is coupled between the alternative terminal P37 and the secondary side ground terminal P38. The current generating circuit ICS in the voltage drop generating circuit 311 is coupled to the secondary side power terminal P35 to receive the secondary side power voltage VDD1. The current generating circuit ICS is also coupled to the resistor component RDT via the alternative terminal P37. In some further embodiments, as shown in FIG. 2, the resistor component RDT in the signal delay setting circuit 131 is arranged outside the isolation integrated circuit 13, and the current generating circuit ICS, the delay time calculation circuit 313, and the signal delay circuit 315 in the signal delay setting circuit 131 are arranged inside the isolation integrated circuit 13.

Following the embodiment in which the delay time calculation circuit 313 and the signal delay circuit 315 are arranged inside the isolation integrated circuit 13, as shown in FIG. 2, the delay time calculation circuit 313 and the signal delay circuit 315 may be integrated into the control logic circuit 371 of the secondary side circuit 137, and the voltage drop generating circuit 311 may be coupled to the control logic circuit 371 via a buffer gate G1, so as to be coupled to the delay time calculation circuit 313. As can be seen from the descriptions of the signal delay setting circuit 131 and the secondary side circuit 137, the signal delay setting circuit 131 is coupled to the secondary side circuit 137, the alternative terminal P37, and the secondary side ground terminal P38.

In the embodiment of FIG. 2, since the current generating circuit ICS and the resistor component RDT are equivalent to being coupled in series between the secondary side power terminal P35 and the secondary side ground terminal P38, a current path will be formed between the secondary side power voltage VDD1 and the secondary side ground voltage VEE1. Specifically, the current path goes through the secondary side power terminal P35, the current generating circuit ICS, the alternative terminal P37, the resistor component RDT, and the secondary side ground terminal P38.

In some embodiments, the primary side power voltage VCC and the secondary side power voltage VDD1 start to rise from 0 volts. After the primary side power voltage VCC and the secondary side power voltage VDD1 rise to a power-on reset voltage POR (for example, 1.2 to 1.8 volts), the isolation integrated circuit 13 will be initialized to a predetermined state to facilitate logic operation in the isolation integrated circuit 13.

Following the embodiment in which the secondary side power voltage VDD1 exceeds the power-on reset voltage POR, in some embodiments, the current generating circuit ICS generates a detection current Id according to the secondary side power voltage VDD1 exceeding the power-on reset voltage POR, wherein the detection current Id may be a constant current. Through the current path, the detection current Id may sequentially flow through the secondary side power terminal P35, the current generating circuit ICS, the alternative terminal P37, and the resistor component RDT, and to the secondary side ground terminal P38. According to the Ohm's law, when the detection current Id flows through the resistor component RDT, a voltage difference VDT will be generated across two terminals of the resistor component RDT (namely, the alternative terminal P37 and the secondary side ground terminal P38).

Figure 3:
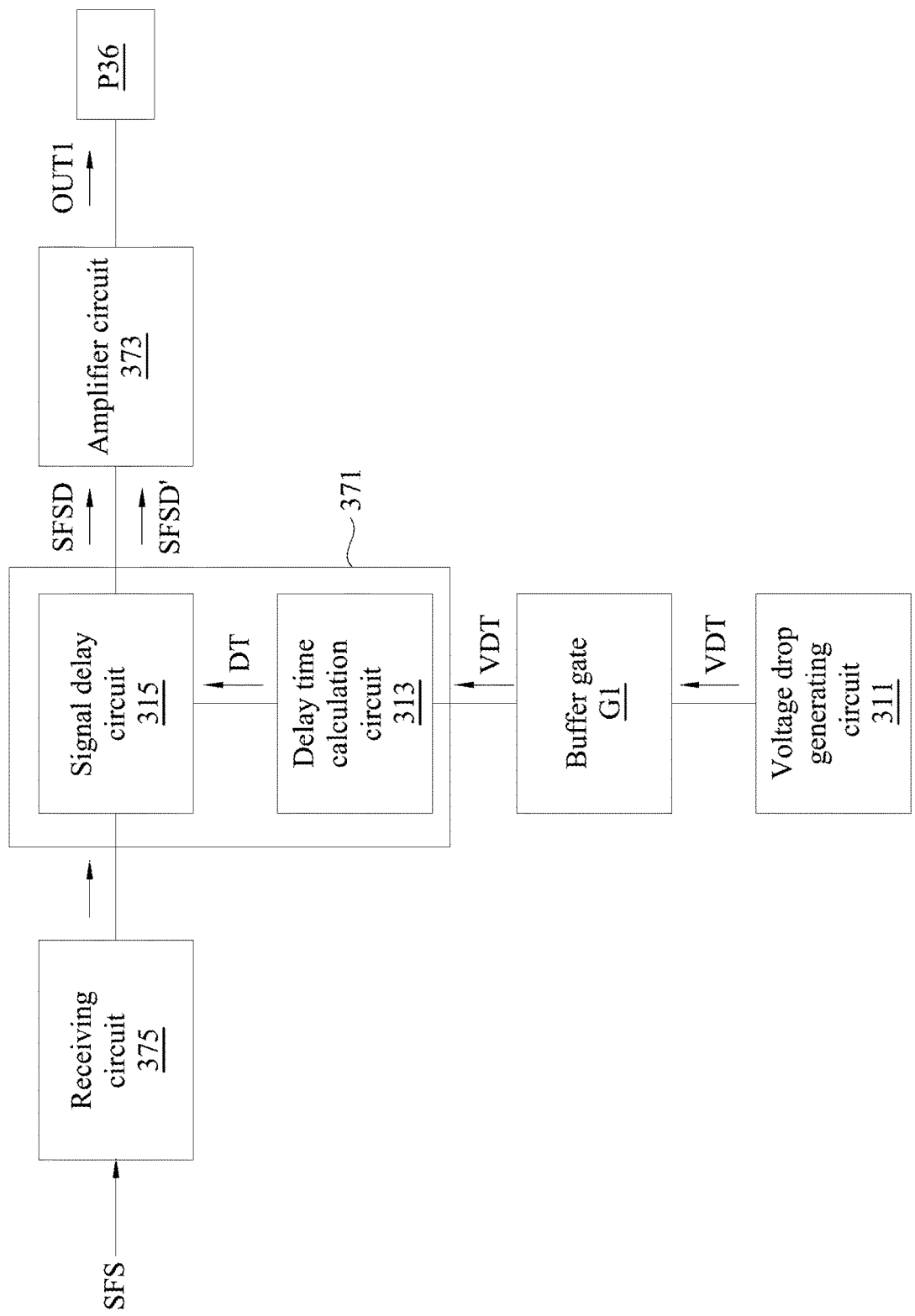
FIG. 3 is a circuit block diagram of a control logic circuit, an amplifier circuit, a receiving circuit, a buffer gate, and a voltage drop generating circuit according to some embodiments of the present disclosure.

Refer to FIG. 3. FIG. 3 is a circuit block diagram of the control logic circuit 371, the amplifier circuit 373, the receiving circuit 375, the buffer gate G1, and the voltage drop generating circuit 311 according to some embodiments of the present disclosure. In some embodiments, the voltage difference VDT generated by the voltage drop generating circuit 311 may be transmitted to the control logic circuit 371 via the buffer gate G1 in the form of a voltage signal. Following the embodiment in which the delay time calculation circuit 313 and the signal delay circuit 315 are integrated into the control logic circuit 371, as shown in FIG. 3, the delay time calculation circuit 313 is coupled to the voltage drop generating circuit 311 via the buffer gate G1, and the signal delay circuit 315 is coupled to the delay time calculation circuit 313, the receiving circuit 375, and the amplifier circuit 373.

In some embodiments, the delay time calculation circuit 313 is configured to calculate a delay time DT according to the voltage difference VDT. Further, the voltage difference VDT may be converted into a detection voltage value by the delay time calculation circuit 313 (or the control logic circuit 371). Specifically, the detection voltage value is a value of a current value (for example, 0.1 to 100 microamperes (μA)) of the detection current Id multiplying a resistance value (for example, 1 kilo-ohm to 500 kilo-ohms (kΩ)) of the resistor component RDT.

Following the embodiment in which the voltage difference VDT is converted into the detection voltage value, the control logic circuit 371 may store a look-up table (not shown) in advance through one or more storage circuits (such as memories), wherein the look-up table records a plurality of voltage values and a plurality of corresponding time lengths. Therefore, the delay time calculation circuit 313 may compare a plurality of voltage values in the lookup table with the detection voltage value, to find a voltage value among the plurality of voltage values that is the same as the detection voltage value, and the time length corresponding to the voltage value can be used as the delay time DT. It should be understood that when a voltage value that is the same as the detection voltage value is not found from the plurality of voltage values, the delay time calculation circuit 313 may further calculate the delay time DT by, for example, but not limited to, interpolation.

The way of calculating the delay time DT is not limited to the above embodiments. For example, in some embodiments, the delay time calculation circuit 313 calculates the delay time DT by substituting the detection voltage value into the following formula (1), where each of a and b may be any preset values, and VSEN may represent the detection voltage value. It should be understood that the delay time calculation circuit 313 is not limited to using the formula (1) to calculate the delay time DT, and any formula that can describe the relationship between the detection voltage value and the delay time DT can be used by the delay time calculation circuit 313 to calculate the delay time DT.

$$DT = a \times VSEN + b \tag{1}$$

In some embodiments, as shown in FIG. 3, after the delay time DT is calculated, the delay time calculation circuit 313 provides the delay time DT to the signal delay circuit 315.

As can be seen from the descriptions of the voltage drop generating circuit 311 and the delay time calculation circuit 313, the signal delay setting circuit 131 of the present disclosure may detect the voltage difference VDT between the alternative terminal P37 and the secondary side ground terminal P38 when the secondary side power voltage VDD1 exceeds the power-on reset voltage POR, and may generate the delay time DT according to the voltage difference VDT.

Figure 4:
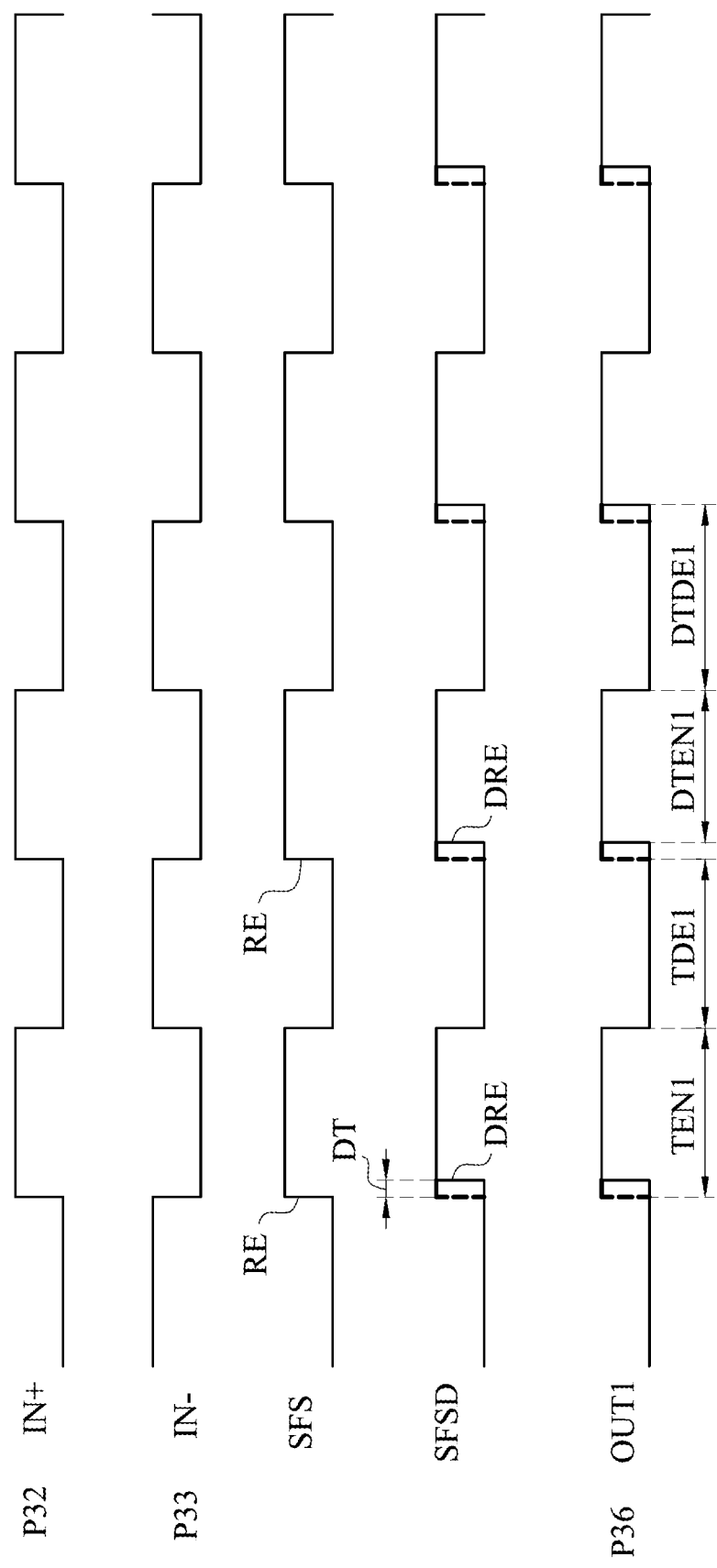
FIG. 4 is a signal timing diagram of an isolation integrated circuit according to some embodiments of the present disclosure.

In some embodiments, after the primary side power voltage VCC and the secondary side power voltage VDD1 continue to rise to an undervoltage lockout voltage UVLO (e.g., 3, 5, and 8 volts) greater than the power-on reset voltage POR, the isolation integrated circuit 13 immediately operates according to the first input signal IN+ and the second input signal IN−. Next, operation of the isolation integrated circuit 13 according to the first input signal IN+ and the second input signal IN− is later described with reference to FIGS. 2 to 4, where FIG. 4 is a timing diagram of some signals related to the isolation integrated circuit 13 according to some embodiments of the present disclosure.

In some embodiments, as shown in FIG. 2, after it is detected that the primary side power voltage VCC exceeds the undervoltage lockout voltage UVLO, the undervoltage lockout circuit 337 in the primary side circuit 133 enables the logic control circuit 331. After that, the primary side circuit 133 receives the first input signal IN+ from the first signal input terminal P32 via the buffer gate 333, and receives the second input signal IN− from the second signal input terminal P33 via the NOT gate 335.

In the embodiment of FIG. 2, the buffer gate 333 buffers the first input signal IN+ and transmits the buffered first input signal IN+ to the AND gate in the logic control circuit 331, and the NOT gate 335 inverts the second input signal IN− and transmits the inverted second input signal IN− to the AND gate in the logic control circuit 331. Further, the AND gate in the logic control circuit 331 generates a primary side signal SFP according to the buffered first input signal IN+ and the inverted second input signal IN−. In some embodiments, the logic control circuit 331 may selectively process (e.g., through buffering, amplification, etc.) the primary side signal SFP and then couple the primary side signal SFP to the isolation circuit 135.

In some embodiments, as shown in FIG. 2, the isolation circuit 135 is configured to convert the primary side signal SFP received from the primary side circuit 133 into a secondary side signal SFS, and transmit the secondary side signal SFS to the secondary side circuit 137, so that the secondary side circuit 137 may generate the output signal OUT1 according to the secondary side signal SFS. It can be seen that the secondary side signal SFS may be viewed as being generated by the isolation integrated circuit 13 according to the first input signal IN+ and the second input signal IN−.

In some embodiments, as shown in FIG. 2, after it is detected that the secondary side power voltage VDD1 exceeds the undervoltage lockout voltage UVLO, the undervoltage lockout circuit 377 in the secondary side circuit 137 enables the receiving circuit 375. In detail, the undervoltage lockout circuit 377 is configured to output an enable signal SEN to the AND gate G3 in the receiving circuit 375 when the secondary side power voltage VDD1 exceeds the undervoltage lockout voltage UVLO. Further, the buffer gate G2 in the receiving circuit 375 receives the secondary side signal SFS from the isolation circuit 135, and buffers the secondary side signal SFS and transmits it to the AND gate G3.

As can be seen from a waveform of the secondary side signal SFS in FIG. 4, the secondary side signal SFS is a periodic signal, and each cycle of the secondary side signal SFS has an enable period (a secondary side signal SFS corresponding to an enable level (e.g., a high voltage level in FIG. 4)) and a disable period (a secondary side signal SFS corresponding to a disable level (e.g., a low voltage level in FIG. 4)). In some embodiments, when the secondary side power voltage VDD1 exceeds the undervoltage lockout voltage UVLO, the enable signal SEN remains at the enable level. Therefore, the AND gate G3 may generate an enable-level signal when the secondary side signal SFS has an enable level and a disable-level signal when the secondary side signal SFS has an disable level. This is equivalent to the receiving circuit 375 being enabled by the undervoltage lockout circuit 377 to transmit the secondary side signal SFS from the isolation circuit 135 to the control logic circuit 371.

When the secondary side signal SFS is transmitted to the control logic circuit 371 via the receiving circuit 375, as shown in FIG. 3, the signal delay circuit 315 delays the secondary side signal SFS according to the delay time DT to output a delayed secondary side signal SFSD (i.e., the delayed secondary side signal SFS) to the amplifier circuit 373. In some further embodiments, as shown in FIG. 4, the signal delay circuit 315 delays a rising edge RE of the secondary side signal SFS according to the delay time DT to generate the delayed secondary side signal SFSD. Therefore, in FIG. 4, a rising edge DRE of the delayed secondary side signal SFSD may lag the rising edge RE of the secondary side signal SFS by about the delay time DT. In this embodiment, the signal delay circuit 315 may be a digital circuit to delay only the rising edge RE of the secondary side signal SFS, but the present invention is not limited to this. In addition, in some variations of the present invention, the signal delay circuit 315 may delay a falling edge of the secondary side signal SFS instead to achieve the same effect.

In addition, as shown in FIG. 2, the control logic circuit 371 is further configured to invert the delayed secondary side signal SFSD to output an inverted delayed secondary side signal SFSD' to the amplifier circuit 373. As can be seen from the above descriptions, the control logic circuit 371 simultaneously outputs the delayed secondary side signal SFSD and the inverted delayed secondary side signal SFSD' to the amplifier circuit 373.

In some embodiments, as shown in FIG. 2 or 3, the amplifier circuit 373 generates the output signal OUT1 according to the delayed secondary side signal SFSD and the inverted delayed secondary side signal SFSD'. In detail, the transistor M1 and the transistor M3 may be implemented with an N-type metal oxide semiconductor transistor, and the transistor M2 may be implemented with a P-type metal oxide semiconductor transistor.

When the delayed secondary side signal SFSD is in a high voltage level as shown in FIG. 4 (that is, the inverted delayed secondary side signal SFSD' is in a low voltage level), the control terminal of the transistor M1 directly receives the delayed secondary side signal SFSD with the high voltage level, so as to turn on the transistor M1. The NOT gate G4 inverts the delayed secondary side signal SFSD with the high voltage level to generate the delayed secondary side signal SFSD with a low voltage level to the control terminal of the transistor M2, so as to turn on the transistor M2. The buffer gate G5 buffers and transmits the inverted delayed secondary side signal SFSD' with the low voltage level to the control terminal of the transistor M3, so as to turn off the transistor M3. Accordingly, the secondary side power voltage VDD1 is transmitted to the signal output terminal P36 via the turned-on transistor M1 and the turned-on transistor M2, which serves as a voltage level of the output signal OUT1 during its enable period DTEN1 (i.e., an enable level of the output signal OUT1), as shown in FIG. 4.

When the delayed secondary side signal SFSD is in a low voltage level (at this time, the inverted delayed secondary side signal SFSD' is in a high voltage level), the control terminal of the transistor M1 directly receives the delayed secondary side signal SFSD with the low voltage level, so as to turn off the transistor M1. The NOT gate G4 inverts the delayed secondary side signal SFSD with the low voltage level to generate the delayed secondary side signal SFSD with a high voltage level to the control terminal of the transistor M2, so as to turn off the transistor M2. The buffer gate G5 buffers the inverted delayed secondary side signal SFSD' with a high voltage level to generate the inverted delayed secondary side signal SFSD' with the high voltage level to the control terminal of the transistor M3, so as to turn on the transistor M3. Accordingly, the signal output terminal P36 is grounded via the turned-on transistor M3, so that a ground voltage serves as a voltage level of the output signal OUT1 during its disable period DTDE1 (i.e., a disable level of the output signal OUT1), as shown in FIG. 4.

As can be seen from the descriptions of the amplifier circuit 373, a waveform of the output signal OUT1 and a waveform of the delayed secondary side signal SFSD are the same in frequency and/or cycle (as shown in FIG. 4), but could be different in amplitude. Specifically, the amplitude of the output signal OUT1 is generally greater than that of the delayed secondary side signal SFSD. That is, in some embodiments, the amplifier circuit 373 is configured to amplify the delayed secondary side signal SFSD to generate the output signal OUT1.

Further, in FIG. 4, thick dashed lines are alternatively used to represent, in a case in which the secondary side signal SFS is not delayed in the secondary side circuit 137 of the isolation integrated circuit 13, waveforms of a plurality of signals that should be present in the secondary side circuit 137. In this case, each cycle of signals output by the isolation integrated circuit 13 via the signal output terminal P36 has an enable period TEN1 and a disable period TDE1. As can be seen from FIG. 4, compared with a signal output when the secondary side signal SFS is not delayed in the secondary side circuit 137, an output signal OUT1 generated using the circuit architecture of FIG. 2 has a lower duty ratio (namely, dividing a cycle of the output signal OUT1 by an enable period DTEN1). The aforementioned lower duty ratio may prevent the high-side switch 17 and the low-side switch 19 in FIG. 1 from being turned on at the same time. The details thereof will be described in detail in the following paragraphs with reference to FIG. 6.

Figure 5:
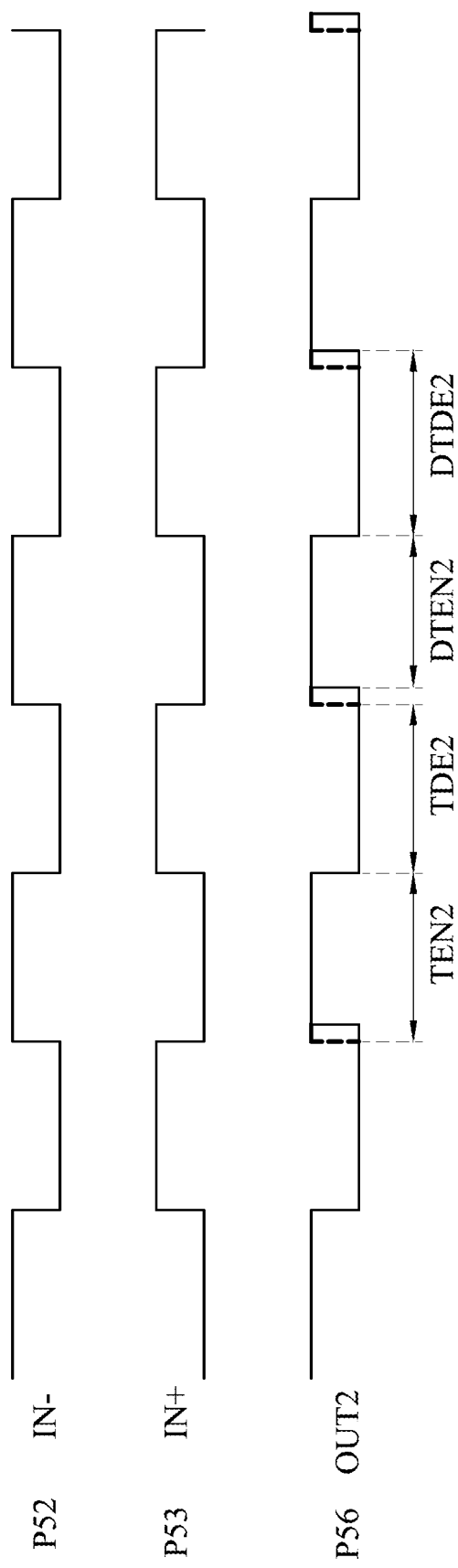
FIG. 5 is a signal timing diagram of an isolation integrated circuit according to some embodiments of the present disclosure.

Refer to FIG. 5. FIG. 5 is a timing diagram of some signals related to the isolation integrated circuit 15 according to some embodiments of the present disclosure. It should be understood that the isolation integrated circuit 15 in FIG. 1 may adopt the same or similar circuit architecture as the isolation integrated circuit 13 in FIG. 2, so that the detailed descriptions of the isolation integrated circuit 15 is omitted here.

As shown in FIG. 1, a main difference between the isolation integrated circuit 15 and the isolation integrated circuit 13 is that the isolation integrated circuit 15 receives the second input signal IN− via the first signal input terminal P52, and receives the first input signal IN+ via the second signal input terminal P53. In this case, a waveform of the output signal OUT2 generated by the isolation integrated circuit 15 is shown in FIG. 5. Each cycle of the output signal OUT2 has an enable period DTEN2 (an output signal OUT2 corresponding to a enable level) and a disable period DTDE2 (an output signal OUT2 corresponding to a disable level).

In addition, in FIG. 5, thick dashed lines are used to represent waveforms of signals output by the isolation integrated circuit 15, in a case where the secondary side signal is not delayed in the secondary side circuit of the isolation integrated circuit 15. In this case, each cycle of signals output by the isolation integrated circuit 15 has an enable period TEN2 and a disable period TDE2. As can be seen from FIG. 5, compared with a signal output when the secondary side signal is not delayed in the secondary side circuit of the isolation integrated circuit 15, an output signal OUT2 generated when the secondary side signal is delayed in the secondary side circuit of the isolation integrated circuit 15 has a lower duty ratio (that is, an enable period DTEN2 divided by a cycle of the output signal OUT2). The aforementioned lower duty ratio may prevent the high-side switch 17 and the low-side switch 19 from being turned on at the same time. The details thereof will be described in detail in the following paragraphs with reference to FIG. 6.

In the above embodiments, the high-side switch 17 in FIG. 1 is turned on according to the output signal OUT1 in the enable level (corresponding to the enable period DTEN1 in FIG. 4) and turned off according to the output signal OUT1 in the disable level (corresponding to the disable period DTDE1 in FIG. 4). The low-side switch 19 in FIG. 1 is turned on according to the output signal OUT2 of the enable level (corresponding to the enable period DTEN2 in FIG. 5) and turned off according to the output signal OUT2 of the disable level (corresponding to the disable period DTDE2 in FIG. 5).

Figure 6:
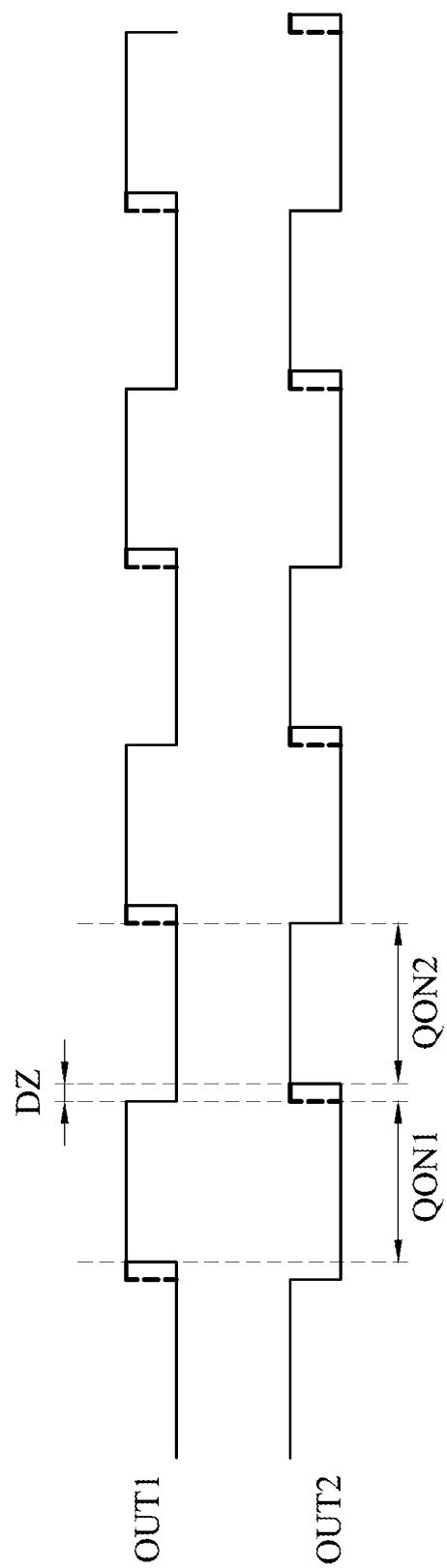
FIG. 6 is a timing diagram of output signals of two isolation integrated circuits according to some embodiments of the present disclosure.

Then, the relationship between the output signal OUT1 and the output signal OUT2 is further explained with reference to FIG. 6. FIG. 6 is a timing diagram of the output signal OUT1 and the output signal OUT2 according to some embodiments of the present disclosure. As can be seen from the above descriptions, the signal delay setting circuit 131 controls the isolation integrated circuit 13 to generate an output signal OUT1 with a lower duty ratio, and the signal delay setting circuit 151 controls the isolation integrated circuit 15 to generate an output signal OUT2 with a lower duty ratio. Accordingly, as shown in FIG. 6, the high-side switch 17 is turned on in a period QON1 (corresponding to the enable period DTEN1 of the output signal OUT1 shown in FIG. 4), and the low-side switch 19 is turned on in a period QON2 (corresponding to the enable period DTEN2 of the output signal OUT2 shown in FIG. 5). The period QON1 and the period QON2 do not overlap, which means that the high-side switch 17 and the low-side switch 19 will not be turned on at the same time. A period DZ between the period QON1 and the period QON2 is generally called a dead zone or dead time.

As can be seen from the above descriptions, when the secondary side power voltage VDD1 exceeds the power-on reset voltage POR, the signal delay setting circuit 131 of the present disclosure may generate the delay time DT according to the voltage difference VDT between the alternative terminal P37 and the secondary side ground terminal P38. Further, when the secondary side power voltage VDD1 exceeds the undervoltage lockout voltage UVLO, the signal delay setting circuit 131 of the present disclosure may delay the secondary side signal SFS according to the delay time DT to control the duty ratio of the output signal OUT1. It should be understood that the above descriptions of the signal delay setting circuit 131 are also applicable to the signal delay setting circuit 151 in the isolation integrated circuit 15, and thus the descriptions of the signal delay setting circuit 151 is omitted here. In some embodiments, the power-on reset voltage POR may be regarded as a predetermined voltage, and the undervoltage lockout voltage UVLO may be regarded as a protection voltage.

The voltage drop generating circuit 311, the delay time calculation circuit 313, and the signal delay circuit 315 in the signal delay setting circuit 131 are not limited to the circuit architectures shown in FIGS. 2 and 3. Any circuit architecture that can achieve the aforementioned operations (for example, when the secondary side power voltage VDD1 exceeds the power-on reset voltage POR, the voltage difference VDT is generated between the alternative terminal P37 and the secondary side ground terminal P38, the delay time DT is generated according to the voltage difference VDT, and the secondary side signal SFS is delayed according to the delay time DT, etc.) can be used to implement the signal delay setting circuit 131.

It should be understood that operations of the control logic circuit 371 and the amplifier circuit 373 are not limited to the embodiment of FIG. 2. In some embodiments, the buffer gate G5 in the amplifier circuit 373 is replaced by another NOT gate, and one data output terminal of the control logic circuit 371 is directly coupled to the control terminal of the transistor M1, coupled to the control terminal of the transistor M2 via the NOT gate G4, and coupled to the control terminal of the transistor M3 via the another NOT gate. In operations, the control logic circuit 371 may output the delayed secondary side signal SFSD to the control terminal of the transistor M1, the NOT gate G4, and the another NOT gate via the one data output terminal, so that the amplifier circuit 373 may amplify the delayed secondary side signal SFSD to generate the output signal OUT1.

It should be understood that operations of the primary side circuit 133, the isolation circuit 135, and the secondary side circuit 137 are not limited to the above embodiments. In some embodiments, the logic control circuit 331 modulates, through a modulator, the primary side signal SFP according to a fundamental frequency signal provided by a oscillator to generate a primary side modulation signal. The isolation circuit 135 converts the primary side modulation signal into a secondary side modulation signal and outputs the secondary side modulation signal to the secondary side circuit 137. The secondary side circuit 137 may further include a demodulator, and the secondary side modulation signal may be demodulated by the demodulator to generate a signal substantially the same as the secondary side signal SFS to the receiving circuit 375.

It can be seen from the embodiments of the present disclosure that the duty ratio of the output signal OUT1 generated by the isolation integrated circuit 13 and the duty ratio of the output signal OUT2 generated by the isolation integrated circuit 15 are controlled by the signal delay setting circuit 131 and the signal delay setting circuit 151, respectively, so that the power conversion circuitry 100 of the present disclosure may effectively generate a dead time to prevent the high-side switch 17 and the low-side switch 19 from being turned on at the same time, thus achieving the effect of protecting the high-side switch 17 and the low-side switch 19. In addition, compared with some related art techniques that generate a dead time by using RC circuit settings or using trimming methods, the isolation integrated circuit 13, the isolation integrated circuit 15, and the power conversion circuitry 100 of the present disclosure have the advantages of low deviation, high reliability, small requirements for circuit area, and the like.

Although the present disclosure has been disclosed in the above embodiments, it is not intended to limit the scope of the present disclosure. Those of ordinary skills in the art can make various changes and modifications without departing from the spirit and scope of the present disclosure, so that the protection scope of the present disclosure should be determined by the appended claims.

What is claimed is:

1. A signal delay setting circuit applicable to an isolation integrated circuit, wherein the isolation integrated circuit comprises a primary side circuit, an isolation circuit, and a secondary side circuit, and the secondary side circuit is coupled to an alternative terminal and a secondary side ground terminal of the isolation integrated circuit, the isolation circuit is configured to convert a primary side signal from the primary side circuit into a secondary side signal, and the signal delay setting circuit comprises:
   a voltage drop generating circuit, coupled to the alternative terminal and the secondary side ground terminal, and configured to generate a voltage difference between the alternative terminal and the secondary side ground terminal;
   a delay time calculation circuit, coupled to the voltage drop generating circuit, and configured to calculate a delay time according to the voltage difference; and
   a signal delay circuit, coupled to the delay time calculation circuit, and configured to delay the secondary side signal received by the secondary side circuit from the isolation circuit according to the delay time, so as to control a duty ratio of an output signal generated by the secondary side circuit according to the secondary side signal, wherein the primary side signal is generated by the primary side circuit according to a first input signal and a second input signal.

2. The signal delay setting circuit according to claim 1, wherein the voltage drop generating circuit comprises:
   a resistor component, coupled between the alternative terminal and the secondary side ground terminal; and
   a current generating circuit, coupled with the resistor component at the alternative terminal, configured to receive a secondary side power voltage provided to the secondary side circuit, and configured to output a detection current flowing through the resistor component according to the secondary side power voltage, so that the voltage difference is generated between the alternative terminal and the secondary side ground terminal.

3. The signal delay setting circuit according to claim 2, wherein the resistor component is arranged outside the isolation integrated circuit, and the current generating circuit is arranged inside the isolation integrated circuit.

4. The signal delay setting circuit according to claim 1, wherein the delay time calculation circuit and the signal delay circuit are integrated into a control logic circuit of the secondary side circuit, and the voltage drop generating circuit is coupled to the control logic circuit via a buffer gate.

5. The signal delay setting circuit according to claim 1, wherein the signal delay circuit is configured to delay a plurality of rising edges of the secondary side signal by the delay time.

6. The signal delay setting circuit according to claim 1, wherein the delay time calculation circuit calculates the delay time according to the voltage difference by using a look-up table or through formula calculation.

7. The signal delay setting circuit according to claim 1, wherein the secondary side circuit is configured to receive a secondary side power voltage via a secondary side power terminal of the isolation integrated circuit, and the voltage drop generating circuit is configured to generate the voltage difference when the secondary side power voltage exceeds a power-on reset voltage.

8. The signal delay setting circuit according to claim 7, wherein the signal delay circuit is configured to delay the secondary side signal according to the delay time when the secondary side power voltage exceeds an undervoltage lockout voltage, wherein the undervoltage lockout voltage is greater than the power-on reset voltage.

9. An isolation integrated circuit, comprising:
a primary side circuit, configured to receive a first input signal and a second input signal and generate a primary side signal according to the first input signal and the second input signal;
an isolation circuit, coupled to the primary side circuit, and configured to convert the primary side signal into a secondary side signal;
a secondary side circuit, coupled to the isolation circuit, and configured to receive the secondary side signal via the isolation circuit, generate an output signal according to the secondary side signal, and receive a secondary side power voltage; and
a signal delay setting circuit, coupled to the secondary side circuit and an alternative terminal and a secondary side ground terminal of the isolation integrated circuit, and configured to detect a voltage difference between the alternative terminal and the secondary side ground terminal when the secondary side power voltage exceeds a predetermined voltage, calculate a delay time according to the voltage difference, and delay the secondary side signal according to the delay time to control a duty ratio of the output signal.

10. The isolation integrated circuit according to claim 9, wherein the signal delay setting circuit comprises:
a voltage drop generating circuit, coupled to the alternative terminal and the secondary side ground terminal, and configured to receive the secondary side power voltage and generate the voltage difference between the alternative terminal and the secondary side ground terminal when the secondary side power voltage exceeds the predetermined voltage;
a delay time calculation circuit, coupled to the voltage drop generating circuit, and configured to calculate the delay time according to the voltage difference; and
a signal delay circuit, coupled to the delay time calculation circuit, and configured to delay the secondary side signal according to the delay time.

11. The isolation integrated circuit according to claim 10, wherein the voltage drop generating circuit comprises:
a resistor component, coupled between the alternative terminal and the secondary side ground terminal; and
a current generating circuit, coupled with the resistor component at the alternative terminal, and configured to output a detection current to flow through the resistor component according to the secondary side power voltage exceeding the predetermined voltage, so that the voltage difference is generated between the alternative terminal and the secondary side ground terminal.

12. The isolation integrated circuit according to claim 11, wherein the resistor component is arranged outside the isolation integrated circuit, and the current generating circuit is arranged inside the isolation integrated circuit.

13. The isolation integrated circuit according to claim 10, wherein the secondary side circuit comprises a control logic circuit and a first buffer gate, the delay time calculation circuit and the signal delay circuit are integrated into the control logic circuit, and the voltage drop generating circuit is coupled to the control logic circuit via the first buffer gate.

14. The isolation integrated circuit according to claim 13, wherein the secondary side circuit further comprises an amplifier circuit, and the amplifier circuit is coupled to the control logic circuit, and a secondary side power terminal and a signal output terminal of the isolation integrated circuit, and is configured to amplify the secondary side signal being delayed to generate the output signal to the signal output terminal.

15. The isolation integrated circuit according to claim 13, wherein the secondary side circuit further comprises a receiving circuit and an undervoltage lockout circuit; the receiving circuit is coupled to the isolation circuit, the undervoltage lockout circuit, and the control logic circuit; and the undervoltage lockout circuit is coupled to a secondary side power terminal of the isolation integrated circuit, and is configured to enable the receiving circuit to transmit the secondary side signal to the control logic circuit when the secondary side power voltage exceeds a protection voltage greater than the predetermined voltage.

16. The isolation integrated circuit according to claim 15, wherein the receiving circuit comprises a second buffer gate and an AND gate, the second buffer gate is coupled to the isolation circuit and a first input terminal of the AND gate, the undervoltage lockout circuit is coupled to a second input terminal of the AND gate, and the control logic circuit is coupled to an output terminal of the AND gate.

17. The isolation integrated circuit according to claim 10, wherein the signal delay circuit is configured to delay a plurality of rising edges of the secondary side signal by the delay time.

18. The isolation integrated circuit according to claim 10, wherein the delay time calculation circuit calculates the delay time according to the voltage difference by using a look-up table or through formula calculation.

19. The isolation integrated circuit according to claim 10, wherein the predetermined voltage is a power-on reset voltage, and the signal delay circuit is configured to delay the secondary side signal according to the delay time when the secondary side power voltage exceeds an undervoltage lockout voltage, wherein the undervoltage lockout voltage is greater than the power-on reset voltage.

20. A power conversion circuitry, comprising:
a high-side switch;
a low-side switch;
a controller circuit, configured to output a first input signal and a second input signal;
a first isolation integrated circuit, coupled between the controller circuit and the high-side switch, and comprising a first signal delay setting circuit, a first signal input terminal, a second signal input terminal, a first alternative terminal, and a first secondary side ground terminal, wherein the first isolation integrated circuit is configured to receive the first input signal via the first signal input terminal, receive the second input signal via the second signal input terminal, to generate a first output signal for driving the high-side switch; and
a second isolation integrated circuit, coupled between the controller circuit and the low-side switch, and comprising a second signal delay setting circuit, a third signal input terminal, a fourth signal input terminal, a second alternative terminal, and a second secondary side ground terminal, wherein the second isolation integrated circuit is configured to receive the second input signal via the third signal input terminal, receive the first input signal via the fourth signal input terminal, to generate a second output signal for driving the low-side switch,
wherein when a first secondary side power voltage received by the first isolation integrated circuit and a second secondary side power voltage received by the second isolation integrated circuit exceed a predetermined voltage, the first signal delay setting circuit calculates a first delay time according to a first voltage difference between the first alternative terminal and the first secondary side ground terminal, and the second signal delay setting circuit calculates a second delay time according to a second voltage difference between the second alternative terminal and the second secondary side ground terminal, and wherein when the first secondary side power voltage and the second secondary side power voltage exceed a protection voltage greater than the predetermined voltage, the first signal delay setting circuit delays a first secondary side signal generated by the first isolation integrated circuit according to the first input signal and the second input signal according to the first delay time to control a duty ratio of the first output signal, and the second signal delay setting circuit delays a second secondary side signal generated by the second isolation integrated circuit according to the first input signal and the second input signal according to the second delay time to control a duty ratio of the second output signal, so that the high-side switch and the low-side switch are not turned on at the same time.

* * * * *